(12) United States Patent
Shimizu et al.

(10) Patent No.: US 9,961,817 B2
(45) Date of Patent: May 1, 2018

(54) SUBSTRATE WORKING MACHINE

(71) Applicant: FUJI MACHINE MFG. CO., LTD., Chiryu (JP)

(72) Inventors: Toshinori Shimizu, Kariya (JP); Toshihiko Yamasaki, Nisshin (JP); Hiroyasu Ohashi, Toyota (JP); Masaki Murai, Nishio (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 375 days.

(21) Appl. No.: 14/425,150

(22) PCT Filed: Sep. 28, 2012

(86) PCT No.: PCT/JP2012/075089
§ 371 (c)(1),
(2) Date: Mar. 2, 2015

(87) PCT Pub. No.: WO2014/049833
PCT Pub. Date: Apr. 3, 2014

(65) Prior Publication Data
US 2015/0208562 A1 Jul. 23, 2015

(51) Int. Cl.
*H05K 13/04* (2006.01)
*H05K 13/02* (2006.01)

(52) U.S. Cl.
CPC ....... *H05K 13/0469* (2013.01); *H05K 13/021* (2013.01); *H05K 13/0417* (2013.01); *H05K 13/0434* (2013.01); *Y10T 29/53174* (2015.01)

(58) Field of Classification Search
CPC ......... Y10T 29/53174; Y10T 29/53178; Y10T 29/53191; Y10T 29/53261;
(Continued)

(56) References Cited

U.S. PATENT DOCUMENTS 5,073,079 A 12/1991 Akagawa
6,389,683 B1 * 5/2002 Mori ............... B23K 3/082
29/740
(Continued)

FOREIGN PATENT DOCUMENTS

CN 1993035 A 7/2007
JP 2001-85830 A 3/2001
(Continued)

OTHER PUBLICATIONS

Machine Translation of description section of JP2011249646 provided by EPO website (espacenet.com).*
(Continued)

*Primary Examiner* — A. Dexter Tugbang
*Assistant Examiner* — Joshua D Anderson
(74) *Attorney, Agent, or Firm* — Oblon, McClelland, Maier & Neustadt, L.L.P.

(57) ABSTRACT

A substrate working machine that performs mounting work on a circuit substrate is provided. The machine includes a receiving section that receives a first mounting work-correspondence device and a mounting stand on which a second mounting work-correspondence device is detachably mounted. The mounting work-correspondence device includes at least one of a device supplying an item necessary for the mounting work, a device discharging an item unnecessary in the mounting work, and a device performing processing required for the mounting work. The receiving section and the mounting stand are disposed at a predetermined edge portion of a base.

9 Claims, 9 Drawing Sheets

(58) Field of Classification Search
CPC ...... Y10T 29/53265; H05K 3/30; H05K 3/34; H05K 3/341; H05K 3/3468; H05K 13/02; H05K 13/021; H05K 13/04; H05K 13/0408; H05K 13/0417; H05K 13/0434; H05K 13/0452; H05K 13/046; H05K 13/0465; H05K 13/0469; H05K 13/0478; H01L 21/67724; H01L 21/67775
USPC .................. 29/739, 740, 743, 771, 757, 759
See application file for complete search history.

(56) References Cited

U.S. PATENT DOCUMENTS

| | | | | |
|---|---|---|---|---|
| 6,408,505 B1* | 6/2002 | Hata | ................... | H05K 13/0413 29/564.1 |
| 6,594,887 B1* | 7/2003 | Okuda | ............... | H05K 13/0452 29/739 |
| 7,353,589 B2* | 4/2008 | Kawasumi | ......... | H05K 13/0408 29/720 |
| 7,957,822 B2* | 6/2011 | Morita | ................... | H05K 13/08 29/743 |
| 2008/0217394 A1* | 9/2008 | Okada | ................ | H05K 13/0417 235/375 |
| 2008/0313890 A1* | 12/2008 | Kino | .................. | H05K 13/0408 29/740 |
| 2011/0098840 A1 | 4/2011 | Inaba et al. | | |
| 2012/0240388 A1* | 9/2012 | Ishimoto | ............ | H05K 13/0452 29/593 |
| 2013/0247368 A1* | 9/2013 | Kawase | ............. | H05K 13/0452 29/832 |

FOREIGN PATENT DOCUMENTS

| | | |
|---|---|---|
| JP | 2001-326499 | 11/2001 |
| JP | 3425504 | 7/2003 |
| JP | 3889483 | 3/2007 |
| JP | 2007-201416 A | 8/2007 |
| JP | 2010-16028 | 1/2010 |
| JP | 2010-206059 | 9/2010 |
| JP | 2011-211219 | 10/2011 |
| JP | 2011-249646 | 12/2011 |

OTHER PUBLICATIONS

Extended European Search Report dated Mar. 30, 2016 Application No. 12885570.7.
Combined Chinese Office Action and Search Report dated Oct. 25, 2016 in Chinese Patent Application No. 201280076107.3 (English language translation of the Office Action and English translation of Category of Cited Documents).
International Search Report dated Dec. 25, 2012 in PCT/JP12/075089 Filed Sep. 28, 2012.
Chinese Office Action dated Apr. 13, 2017 in Patent Application No. 201280076107.3 (English Translation only).

\* cited by examiner

SUBSTRATE WORKING MACHINE

TECHNICAL FIELD

The present disclosure relates to a substrate working machine that performs mounting work on a circuit substrate.

BACKGROUND ART

A substrate working machine that performs mounting work on a circuit substrate is provided with a device that supplies an item necessary for the mounting work to be performed on the circuit substrate, a device that discharges an item unnecessary in the mounting work, a device that performs processing required for the mounting work, and the like. A device that is provided so as to correspond to such mounting work (hereinafter, referred to as a "mounting work-correspondence device") is exchanged according to the kind of the mounting work.

For example, mounting stands are fixed onto bases of many substrate working machines, and mounting work-correspondence devices are detachably mounted on the mounting stands. Accordingly, the mounting work-correspondence device is adapted so as to be capable of being exchanged according to the kind of the mounting work. Further, for example, in a substrate working machine disclosed in the following patent literatures, wheels are provided on the lower surface of a mounting work-correspondence device and a receiving section, which receives the mounting work-correspondence device with the wheels, is formed on the side surface of the substrate working machine. Accordingly, even though the size of a mounting work-correspondence device is large to a certain degree, the mounting work-correspondence device can be easily exchanged.

PTL 1: Japanese Patent No. 3425504
PTL 2: Japanese Patent No. 3889483

DISCLOSURE

Technical Problem

As the mounting work, there is work that requires many mounting work-correspondence devices. For this reason, in order to mount many mounting work-correspondence devices on a substrate working machine, it is considered that a receiving section and a mounting stand are provided on a base of the substrate working machine. On the other hand, most of the bases of substrate working machines are formed in a substantially rectangular shape. When a receiving section is disposed on one side of both sides facing each other on the rectangular base and a mounting stand is disposed on the other side, an operator needs to come and go to both sides of the substrate working machine to perform exchange, maintenance, and the like of the mounting work-correspondence devices, which is very inconvenient. The disclosure has been made in consideration of the above-mentioned circumstances, and an object of the disclosure is to provide a very convenient substrate working machine that includes a receiving section and amounting stand.

Technical Solution

In order to achieve the object, one embodiment of a substrate working machine is a substrate working machine that performs mounting work on a circuit substrate. When a device functioning as at least one of a device supplying an item necessary for the mounting work to be performed on the circuit substrate, a device discharging an item unnecessary in the mounting work, and a device performing processing required for the mounting work is defined as a mounting work-correspondence device, the substrate working machine includes a receiving section that receives a first mounting work-correspondence device including a moving mechanism moving to an arbitrary position on a floor, and a mounting stand on which a second mounting work-correspondence device different from the first mounting work-correspondence device received in the receiving section is detachably mounted. The mounting stand and the receiving section are disposed at a predetermined edge portion of a base.

Further, in another embodiment of the substrate working machine, the mounting stand and the receiving section are disposed at a predetermined edge portion of the base so as to be adjacent to each other.

Furthermore, another embodiment of the substrate working machine further includes a conveying device that is provided on the base and conveys the circuit substrate and a processing device that performs processing before or after the mounting work, and the processing device is provided on the base between the mounting stand and the conveying device.

Moreover, in another embodiment of the substrate working machine, both of the first mounting work-correspondence device and the second mounting work-correspondence device function as a device that supplies a mounting component to be mounted on the circuit substrate, and a supply position for a mounting component supplied by the first mounting work-correspondence device and a supply position for a mounting component supplied by the second mounting work-correspondence device are positioned on one row.

Further, in another embodiment of the substrate working machine, the second mounting work-correspondence device is at least one of a viscous fluid supply device that supplies viscous fluid fixing the mounting component to the circuit substrate, a component discharge device that discharges an unnecessary mounting component, and a cleaning processing device that performs processing for cleaning a holder holding the mounting component.

Furthermore, another embodiment of the substrate working machine further includes a first cover that covers an upper portion of the substrate working machine and is made of a transparent material, and the first mounting work-correspondence device includes a second cover that covers an upper portion of the first mounting work-correspondence device and is made of a transparent material.

Advantageous Effects

One embodiment of the substrate working machine includes the receiving section that receives the first mounting work-correspondence device and the mounting stand on which the second mounting work-correspondence device is mounted. Accordingly, many mounting work-correspondence devices can be mounted on the substrate working machine, so that it is possible to cope with many kinds of mounting work. Further, the receiving section and the mounting stand are disposed at a predetermined edge portion of the base. Accordingly, since an operator can perform the exchange, maintenance, and the like of the mounting work-correspondence device at a predetermined edge of the base, convenience is improved significantly.

Meanwhile, examples of the mounting work-correspondence device include various devices, such as a device that supplies a mounting component to be mounted on a circuit substrate, a device that supplies viscous fluid fixing the mounting component to the circuit substrate, a device that discharges a defective mounting component, or circuit substrate, and the like, a device that performs processing for exchanging a holder mounted on a work head, a device that performs processing for discarding a mounting component unnecessary in the mounting work, a device that performs processing for taking an image of a mounting component held by the holder, and a device that performs processing for cleaning the holder.

Further, in another embodiment of the substrate working machine, the receiving section and the mounting stand are disposed at a predetermined edge portion of the base so as to be adjacent to each other. Accordingly, an operator hardly needs to move and can perform work on both of the first mounting work-correspondence device received in the receiving section and the second mounting work-correspondence device mounted on the mounting stand.

Another embodiment of the substrate working machine includes the processing device that performs processing before or after the mounting work, and the processing device is provided on the base between the mounting stand and the conveying device. That is, the processing device is positioned on a moving path of the work head or the like that is moved between the second mounting work-correspondence device and the circuit substrate. Accordingly, while the work head is moved between the second mounting work-correspondence device and the circuit substrate, it is possible to perform work using the processing device. Therefore, since it is possible to reduce a moving distance of the work head or the like, it is possible to shorten working time.

Meanwhile, examples of the processing device include various devices, such as a device that performs processing for exchanging a holder mounted on a work head, a device that performs processing for discarding a mounting component unnecessary in the mounting work, a device that performs processing for taking an image of a mounting component held by the holder, and a device that performs processing for cleaning the holder.

Further, in another embodiment of the substrate working machine 4, both of the first mounting work-correspondence device and the second mounting work-correspondence device function as a device that supplies a mounting component, and a supply position for a mounting component supplied by the first mounting work-correspondence device and a supply position for a mounting component supplied by the second mounting work-correspondence device are positioned on one row. Accordingly, since the coordinate of the supply position of the first mounting work-correspondence device in a predetermined direction is the same as the coordinate of the supply position of the second mounting work-correspondence device in the predetermined direction, control is convenient.

Furthermore, in another embodiment of the substrate working machine, at least one of a device supplying viscous fluid, a device discharging an unnecessary mounting component, and a device cleaning a holder is mounted on the mounting stand. These devices are employed in many kinds of mounting work, and are devices that are frequently used. That is, a device, which is not frequently exchanged even when mounting work is changed, is mounted on the mounting stand. Accordingly, it is possible to reduce the number of times of work for mounting/detaching a device on/from the mounting stand.

Moreover, in another embodiment of the substrate working machine, the cover covering the upper portion of the substrate working machine is made of a transparent material. Accordingly, work performed in the working machine can be visually recognized from the outside of the working machine. However, there is a device, which has a relatively large height, as the first mounting work-correspondence device received in the receiving section. For this reason, when such a device is received in the receiving section, there is a concern that work performed in the working machine cannot be visually recognized from the outside of the working machine. In consideration of this concern, the cover covering the upper portion of the first mounting work-correspondence device is also made of a transparent material in the substrate working machine. Accordingly, work performed in the working machine can be visually recognized through the two covers from the outside of the working machine. Further, when the first mounting work-correspondence device is received in the receiving section, an operator can visually recognize the receiving section through the cover that covers the upper portion of the first mounting work-correspondence device. Accordingly, it is possible to appropriately receive the first mounting work-correspondence device in the receiving section.

DESCRIPTION OF EMBODIMENTS

An embodiment of the disclosure will be described in detail below with reference to the drawings.

<Structure of Electronic Component Mounting Machine>

Figure 1:
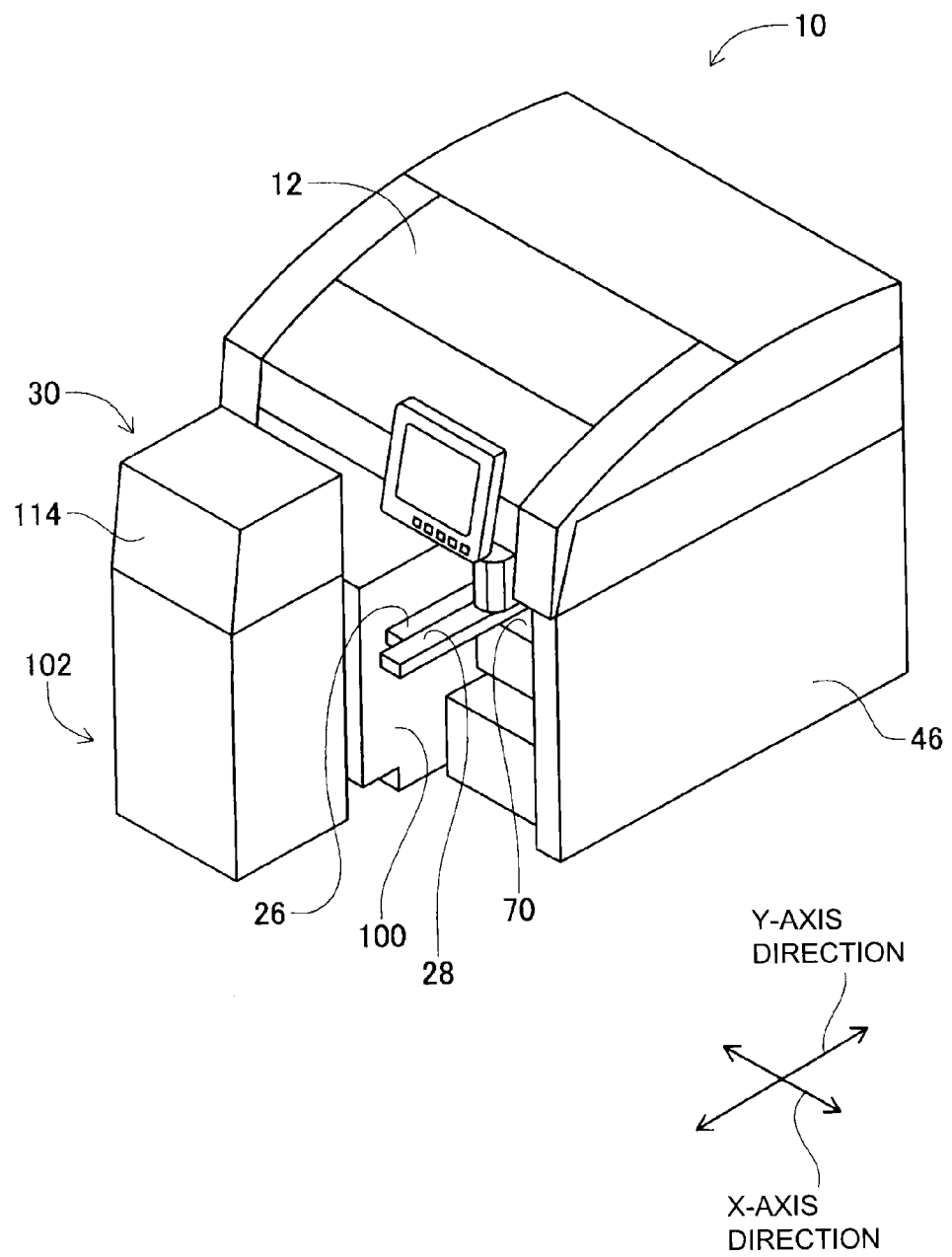
FIG. 1 is a perspective view of an electronic component mounting machine that is an embodiment of the disclosure.
Figure 2:
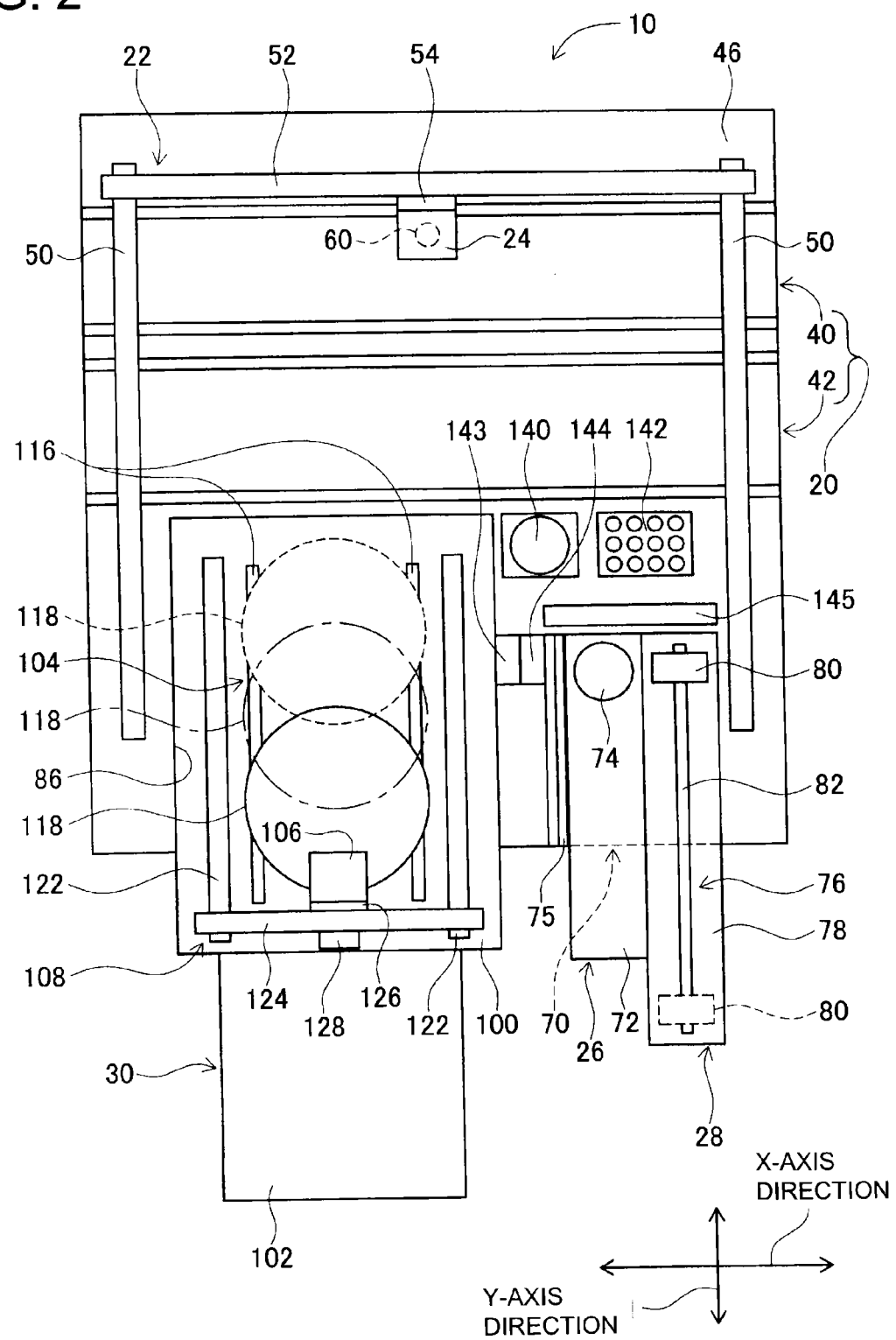
FIG. 2 is a plan view of the electronic component mounting machine of FIG. 1 that is seen from an upper point of view.

FIGS. 1 and 2 show an electronic component mounting machine 10 of an embodiment of the disclosure. FIG. 1 is a perspective view of the electronic component mounting machine 10, and FIG. 2 is a view showing the electronic component mounting machine 10 from which a cover 12 and the like have been removed, from an upper point of view. The electronic component mounting machine 10 is a working machine that mounts an electronic component on a circuit substrate. The electronic component mounting machine 10 includes a conveying device 20, a mounting head moving device (hereinafter, referred to as a "moving device") 22, a mounting head 24, a flux supply device 26, an electronic component discharge device 28, and a die supply device 30. Meanwhile, in the following description, the width direction of the electronic component mounting machine 10 is referred to as an X-axis direction and a horizontal direction orthogonal to the X-axis direction is referred to as a Y-axis direction.

The conveying device 20 includes two conveyor units 40 and 42. These two conveyor units 40 and 42 are provided on a base 46 so as to be parallel to each other and extend in the X-axis direction. Each of the two conveyor units 40 and 42 conveys a circuit substrate in the X-axis direction by the drive of an electromagnetic motor (not shown). Further, the circuit substrate is fixedly held at a predetermined position by a substrate holding device (not shown).

The moving device 22 includes a pair of Y-axis direction guide rails 50 extending in the Y-axis direction and an X-axis direction guide rail 52 extending in the X-axis direction. The X-axis direction guide rail 52 is provided on the pair of Y-axis direction guide rails 50. Further, the X-axis direction guide rail 52 is moved to an arbitrary position in the Y-axis direction by the drive of an electromagnetic motor (not shown). Furthermore, the X-axis direction guide rail 52 holds a slider 54 that can move along an axis thereof. The slider 54 is moved to an arbitrary position in the X-axis direction by the drive of an electromagnetic motor (not shown). The mounting head 24 is mounted on the slider 54. The mounting head 24 is moved to an arbitrary position on the base 46 by this structure.

The mounting head 24 mounts an electronic component on a circuit substrate. The mounting head 24 includes a suction nozzle 60 that is provided on a lower end face of the mounting head. The suction nozzle 60 communicates with a positive/negative pressure supply device (not shown) through a negative-pressure air passage and a positive-pressure air passage. The suction nozzle 60 sucks and holds an electronic component by negative pressure, and separates the held electronic component by positive pressure. Further, the mounting head 24 includes a nozzle lifting unit (not shown) that moves up and down the suction nozzle 60. The mounting head 24 changes the position of the held electronic component in a vertical direction by the nozzle lifting unit. Meanwhile, the suction nozzle 60 is detachably mounted on the mounting head 24.

The flux supply device 26 is provided at one end portion of the base 46 in the Y-axis direction. In detail, the base 46 is formed in a substantially rectangular shape, and a device pallet 70 is fixed to the front edge portion of the base 46 in the Y-axis direction. Further, the flux supply device 26 is mounted on the device pallet 70. The flux supply device 26 includes a body base 72 and a flux tray 74. The body base is formed in a longitudinal shape and extends in the longitudinal direction, and a slide part (not shown) is provided on the bottom of the body base 72. Meanwhile, a plurality of grooves 75 are formed on the upper surface of the device pallet 70 so as to extend in the Y-axis direction. Further, when the slide part of the body base 72 is fitted to the grooves 75, the body base 72 is mounted on the device pallet 70. Furthermore, the body base 72 is detachably mounted on the device pallet 70.

Moreover, the rear end portion of the body base 72 extends from the base 46. Further, the flux tray 74 is placed on the upper surface of the front end portion of the body base 72, and flux is stored in the flux tray 74. Meanwhile, a solution other than flux, specifically, molten solder or the like can be stored in the flux tray 74. Furthermore, the body base 72 is provided with a connector (not shown). When the body base is mounted on the device pallet 70, the connector is connected to a connector connection portion (not shown) of the device pallet 70. Accordingly, the flux supply device 26 is electrically connected to the electronic component mounting machine 10.

The electronic component discharge device 28 includes a moving mechanism 76, a body base 78, and a placing plate 80. The body base 78 is formed in a longitudinal shape and extends in the longitudinal direction, and a slide part (not shown) is provided on the bottom of the body base 78. Further, when the slide part is fitted to the grooves 75 of the device pallet 70, the body base 78 is mounted on the device pallet 70. Furthermore, the body base 78 of the electronic component discharge device 28 is also detachably mounted on the device pallet 70 like the body base 72 of the flux supply device 26.

Further, the moving mechanism 76 includes a rail 82, and the rail 82 is provided on the body base 78 so as to extend in the Y-axis direction. The placing plate 80 is supported by the rail 82 so as to be slidable in an axial direction thereof, and is moved in the Y-axis direction by the drive of an electromagnetic motor (not shown). Specifically, the placing plate 80 is moved between one end portion of the body base 78 that is positioned on the base 46 and the other end portion of the body base 78 that extends from the base 46.

Meanwhile, the body base 78 is provided with a connector (not shown). When the body base 78 is mounted on the device pallet 70, the connector is connected to the connector connection portion of the device pallet 70. Accordingly, the electronic component discharge device 28 is electrically connected to the electronic component mounting machine 10.

Figure 3:
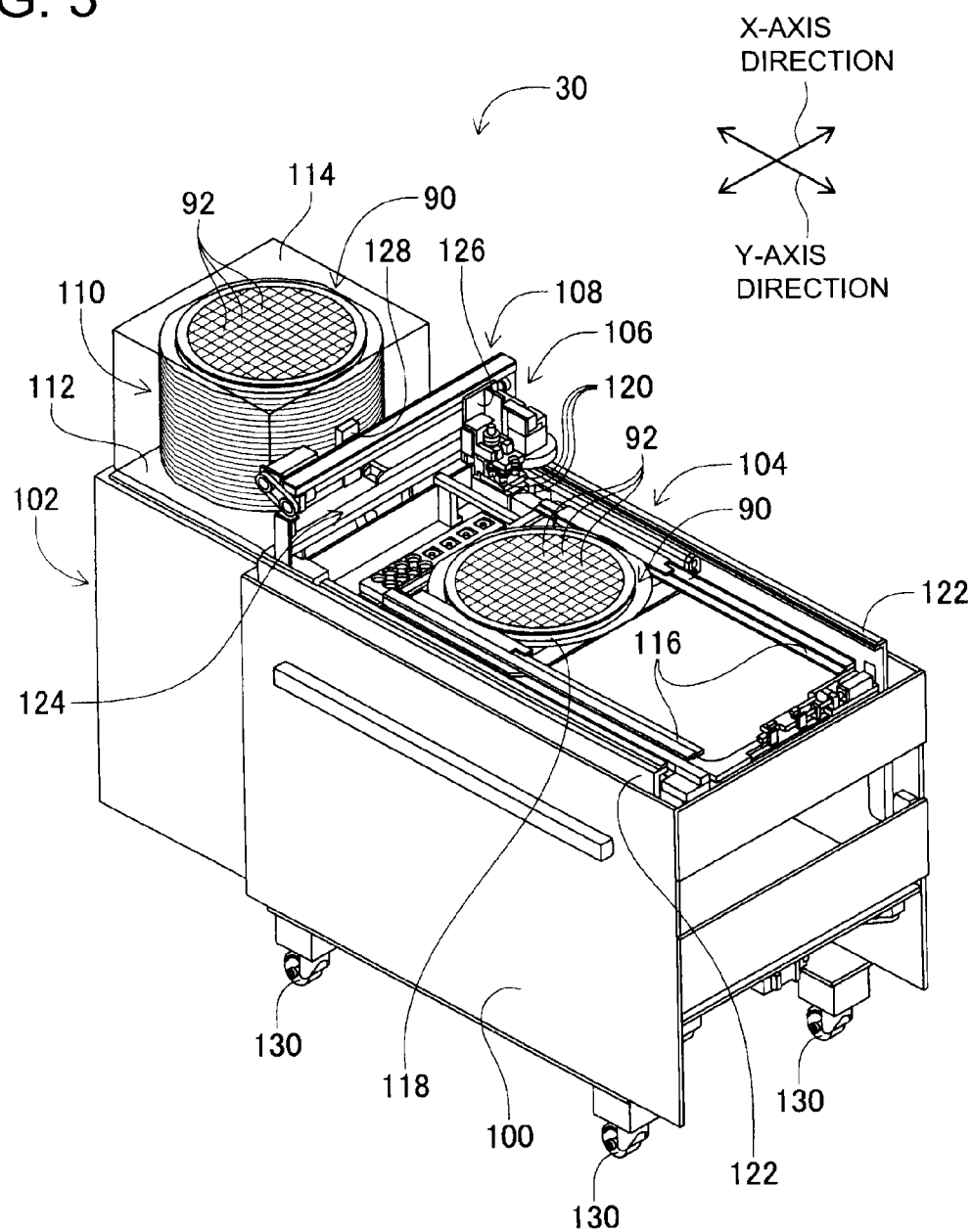
FIG. 3 is a perspective view of a die supply device that is included in the electronic component mounting machine of FIG. 1.

The die supply device 30 is provided at one end portion of the base 46 in the Y-axis direction. In detail, a receiving section 86 having a recessed shape is formed at the edge portion of the base 46 to which the device pallet 70 is fixed, and a part of the die supply device 30 is received in the receiving section 86. As shown in FIG. 3, the die supply device 30 supplies a die 92 from a die collective 90. The die collective 90 is formed by dicing a member that is obtained by attaching a dicing sheet to a wafer.

The die supply device 30 includes a main frame 100, a die collective storing unit 102, a die collective holding unit 104, a picking-up head 106, and a picking-up head moving unit (hereinafter, referred to as a "moving unit") 108.

The die collective storing unit 102 includes a rack 110 and a lifting table 112. The rack 110 is provided on the lifting table 112, and a plurality of die collectives 90 are stored in the rack 110 while being stacked. The lifting table 112 is moved up and down by a table lifting mechanism (not shown), so that the plurality of die collectives 90 are moved in the vertical direction. Further, the die collective 90, which is positioned at a predetermined height, is drawn onto the die collective holding unit 104. Meanwhile, an upper portion of the rack 110 is covered with a rack cover 114. Since the rack cover 114 is made of a transparent material, an operator can see the inside of the rack 110.

The die collective holding unit 104 includes a pair of guide rails 116 and a holding frame 118. The pair of guide rails 116 are provided on the main frame 100 so as to extend in the Y-axis direction, and support the holding frame 118 so that the holding frame 118 is movable in the Y-axis direction. The die collective 90, which is drawn from the die collective storing unit 102, is held by the holding frame 118. Further, the die collective 90, which is held by the holding frame 118, is moved in the Y-axis direction by a frame moving mechanism (not shown).

The picking-up head 106 picks up the dies 92 from the die collective 90, and a plurality of suction nozzles 120 are mounted on the lower surface of the picking-up head 106. Each of the suction nozzles 120 communicates with the positive/negative pressure supply device (not shown). The suction nozzle 120 sucks and holds the die 92 by negative pressure, and separates the held die 92 by positive pressure. Further, the picking-up head 106 is inverted in the vertical direction, so that a nozzle opening of the suction nozzle 120 can face upward. Accordingly, the die 92, which is sucked and held by the suction nozzle 120, is supplied at an upper portion of the picking-up head 106.

The moving unit 108 includes a pair of Y-axis direction guide rails 122 extending in the Y-axis direction and an X-axis direction guide rail 124 extending in the X-axis direction. The X-axis direction guide rail 124 is provided on the pair of Y-axis direction guide rails 122. Further, the X-axis direction guide rail 124 is moved to an arbitrary position in the Y-axis direction by the drive of an electromagnetic motor (not shown). Furthermore, the X-axis direction guide rail 124 holds a slider 126 that can move along an axis thereof. The slider 126 is moved to an arbitrary position in the X-axis direction by the drive of an electromagnetic motor (not shown). The picking-up head 106 is mounted on the slider 126. The picking-up head 106 is moved to an arbitrary position on the main frame 100 by this structure.

A clamp 128 is mounted on the back of the X-axis direction guide rail 124 of the moving unit 108. The clamp 128 grips the die collective 90 that is stored in the rack 110 of the die collective storing unit 102. That is, when the X-axis direction guide rail 124 is moved in the Y-axis direction, the die collective 90 gripped by the clamp 128 is moved in the Y-axis direction. Accordingly, the die collective 90 stored in the rack 110 is drawn onto the holding frame 118.

Further, casters 130 are mounted on legs of the main frame 100 of the die supply device 30. Accordingly, the die supply device 30 can be easily moved on the floor and the die supply device 30 is easily mounted on and detached from the receiving section 86. Meanwhile, the main frame 100 is provided with a connector (not shown), and the receiving section 86 is provided with a connector connection portion (not shown). Accordingly, when the die supply device 30 is received in the receiving section 86, the die supply device 30 is electrically connected to the electronic component mounting machine 10.

Furthermore, as shown in FIG. 2, the electronic component mounting machine 10 includes a part camera 140, a nozzle changer 142, a first discard box 143, a second discard box 144, and a tape discharge duct 145. The part camera 140 is provided between the conveying device 20 and device pallet 70, which are provided on the base 46, so as to face upward. The part camera 140 takes an image of the mounting head 24 from below, and the imaging data of the part camera 140 is processed by an image processor (not shown). Accordingly, it is determined whether an electronic component held by the suction nozzle 60 is good or not. That is, it is determined whether the electronic component is a good component or not. Further, the nozzle changer 142 is provided adjacent to the part camera 140. A plurality of suction nozzles are stored in the nozzle changer 142, and the suction nozzle 60 mounted on the mounting head 24 is exchanged by the nozzle changer 142.

The first discard box 143 and the second discard box 144 are integrally connected to each other, and are provided between the device pallet 70 and the receiving section 86. The first discard box 143 is used to discard the die 92 that is not good, and the second discard box 144 is used to discard an electronic component that is not good. Furthermore, a relatively large component may be discarded into the first discard box 143, and a component smaller than a component to be discarded into the first discard box 143 may be discarded into the second discard box 144. The tape discharge duct 145 is opened between the device pallet 70 and the nozzle changer 142, and a waste tape sent from a tape feeder is inserted into the tape discharge duct 145. The tape discharge duct 145 reaches the outside of the electronic component mounting machine 10 through the inside of the base 46. Accordingly, a waste tape is discharged from the inside of the electronic component mounting machine 10 through the tape discharge duct 145. Meanwhile, the tape feeder will be described below.

Moreover, the cover 12, which covers the upper portion of the electronic component mounting machine 10, is pivotally mounted on the upper portion of the electronic component mounting machine 10 and can be opened and closed. Since the cover 12 is made of a transparent material, an operator can see the inside of the electronic component mounting machine 10 even when the cover 12 is closed. Particularly, the rack cover 114 of the die supply device 30 is also made of a transparent material as described above. For this reason, an operator can see the inside of the electronic component mounting machine 10 even at a portion that is covered with the rack cover 114.

<Mounting Work Performed by Electronic Component Mounting Machine>

Mounting work for mounting the die 92 on a circuit substrate is performed in the electronic component mounting machine 10 by the above-mentioned structure. Specifically, a circuit substrate is conveyed to a work position in response to an instruction of a control device (not shown) of the electronic component mounting machine 10, and the circuit substrate is fixedly held at the position. Further, the die supply device 30 supplies the die 92 by using the picking-up head 106.

In detail, the clamp 128 grips the die collective 90, which is stored in the rack 110, in response to the instruction of the control device. Furthermore, when the X-axis direction guide rail 124 is moved in the Y-axis direction, the die collective 90 gripped by the clamp 128 is drawn onto the holding frame 118. Meanwhile, the die collective 90 drawn from the rack 110 is positioned on the holding frame 118 that is shown by a solid line of FIG. 2. Then, the holding frame 118 is moved in a direction in which the holding frame 118 approaches the conveying device 20, and is fixed at the position of the holding frame 118 that is shown by a dotted line or a dashed-dotted line of FIG. 2. Next, the picking-up head 106 is moved to a position above the die 92 that is to be picked up, and the suction nozzle 120 sucks and holds the die 92. Subsequently, the picking-up head 106 is inverted in the vertical direction. Accordingly, the die 92, which is sucked and held by the suction nozzle 120, is supplied at an upper portion of the picking-up head 106.

When the die 92 is supplied at the upper portion of the picking-up head 106, the mounting head 24 is moved to a position above the picking-up head 106 and the suction nozzle 60 sucks and holds the die 92. Then, the mounting head 24 is moved to a position above the part camera 140, and the part camera 140 takes an image of the die 92. Imaging data, which is obtained from taking an image of the die, is processed by the image processor (not shown), and it is determined whether the die 92 held by the suction nozzle 60 is good or not.

If it is determined that the die 92 is not a non-defective item, that is, is not good, the die 92 is discarded or is discharged to the outside of the electronic component mounting machine 10. In detail, the mounting head 24 is moved to a position above the first discard box 143 and the suction nozzle 60 separates the die 92. Accordingly, the die 92, which is not good, is discarded. Alternatively, the mounting head 24 is moved to a position above the placing plate 80 of the electronic component discharge device 28, and the suction nozzle 60 separates the die 92. Accordingly, the die 92, which is not good, is placed on the placing plate 80. Then, the placing plate 80 is moved to the front end portion of the body base 78 by the moving mechanism 76, and the die 92, which is not good, is discharged to the outside of the electronic component mounting machine 10.

Further, if it is determined that the die 92 is a non-defective item, that is, is good, the mounting head 24 is moved to a position above the flux tray 74 and immerses the held die 92 in flux. Then, the mounting head 24 is moved to a position above a circuit substrate and the die 92 is mounted on the circuit substrate. Meanwhile, the die 92 may be mounted on the circuit substrate without being immersed in the flux. That is, if it is determined that the die 92 is a non-defective item, the mounting head 24 may be moved to a position above the circuit substrate and the die 92 may be mounted on the circuit substrate.

Furthermore, in the die supply device 30, the die 92 can be directly supplied from the die supply device 30 without the use of the picking-up head 106. In detail, after the die collective 90 is drawn onto the holding frame 118 from the rack 110, the holding frame 118 is moved in a direction in which the holding frame 118 approaches the conveying device 20. Accordingly, the die collective 90 is positioned between the holding frame 118 that is shown by a dotted line of FIG. 2 and the holding frame 118 that is shown by a dashed-dotted line of FIG. 2. Subsequently, the mounting head 24 is moved to a position above the die collective 90 in response to the instruction of the control device. Then, the mounting head 24 is moved to an arbitrary position in the X-axis direction above the die collective 90. Alternatively, the holding frame 118 is moved to an arbitrary position in the Y-axis direction. Accordingly, the mounting head 24 is moved to a position above the die 92, which is to be picked up, and the suction nozzle 60 picks up the die 92. In detail, when the mounting head 24 is fixed at a predetermined position and the holding frame 118 is sequentially moved in the Y-axis direction, the plurality of dies 92 lined up in the Y-axis direction are sequentially picked up by the suction nozzle 60. Meanwhile, when the holding frame 118 is fixed at a predetermined position and the mounting head 24 is sequentially moved in the X-axis direction, the plurality of dies 92 lined up in the X-axis direction are sequentially picked up by the suction nozzle 60. Accordingly, the die 92, which is directly picked up from the die collective 90, is mounted on a circuit substrate.

<Change of Mounting Work>

Figure 4:
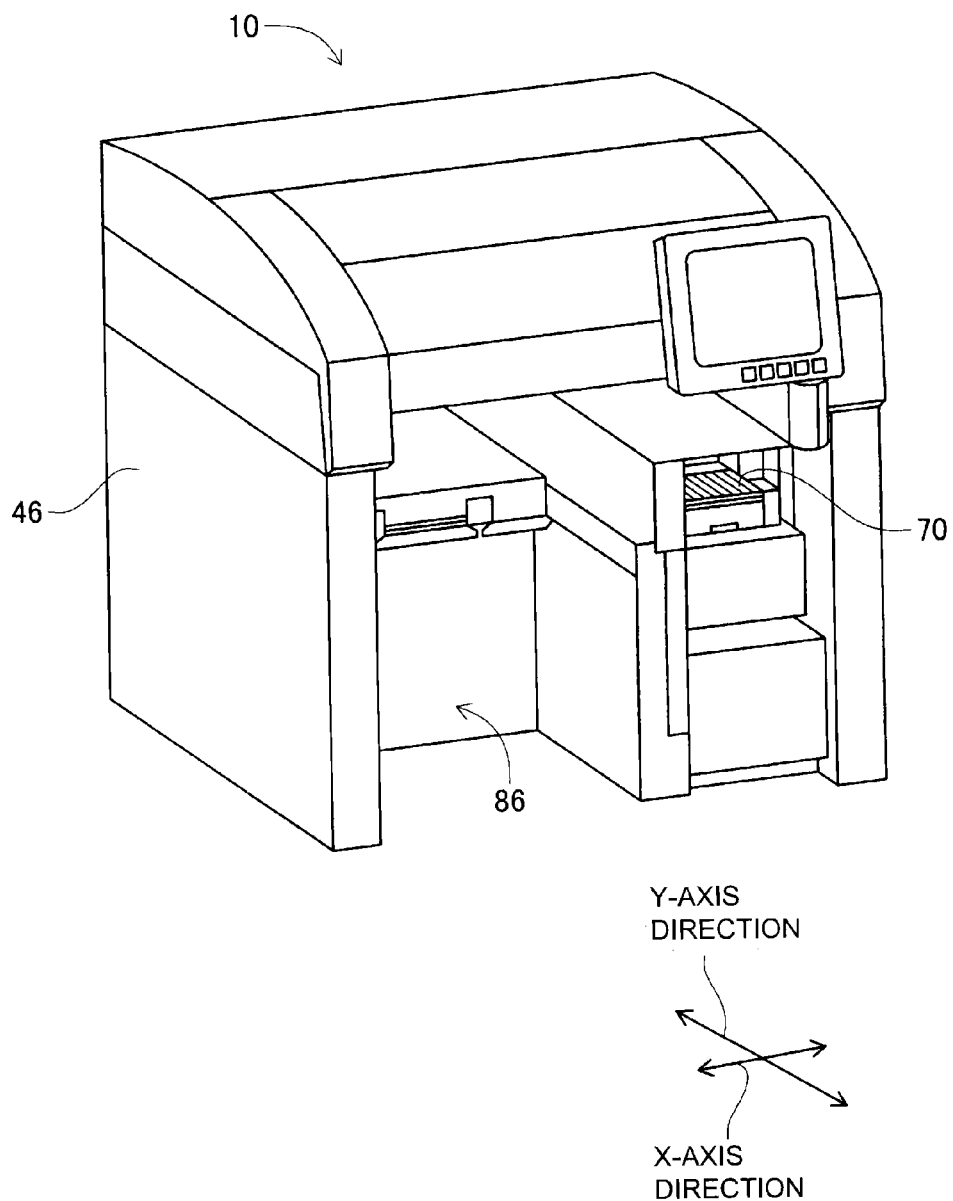
FIG. 4 is a perspective view of the electronic component mounting machine from which the die supply device, a flux supply device, and an electronic component discharge device have been removed.
Figure 5:
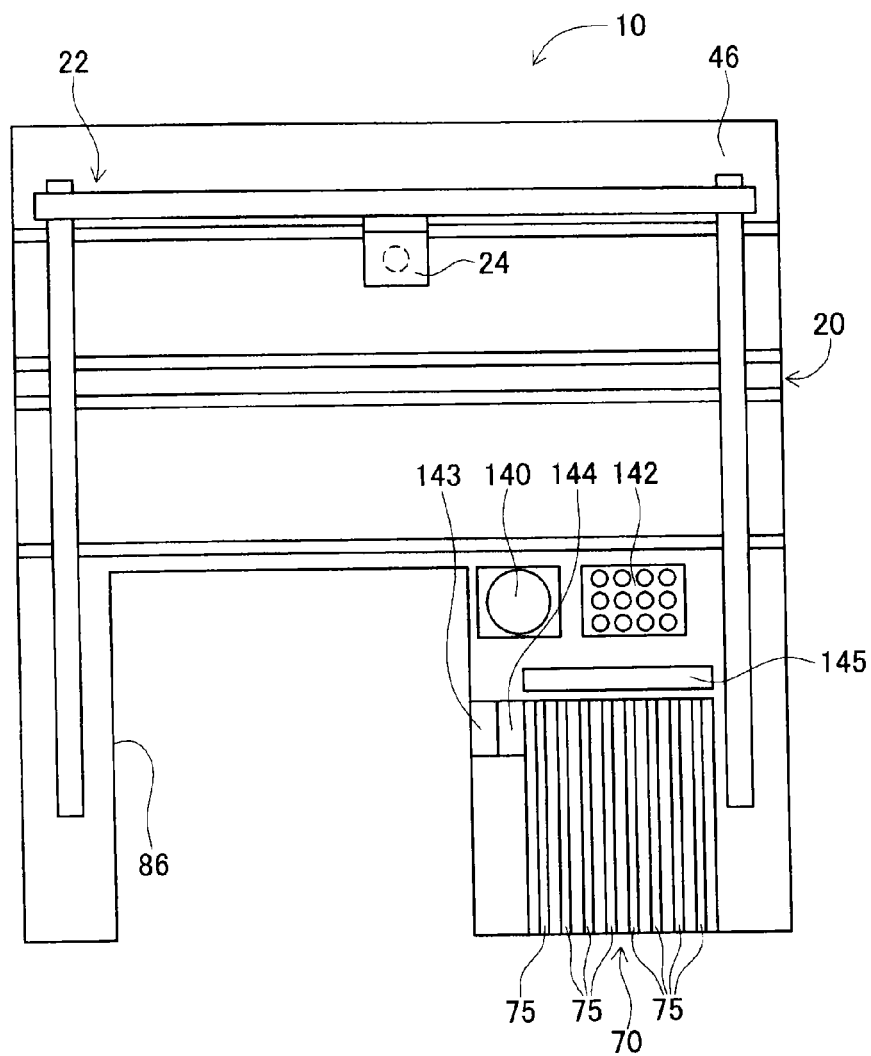
FIG. 5 is a plan view of the electronic component mounting machine from which the die supply device, the flux supply device, and the electronic component discharge device have been removed that is seen from an upper point of view.
Figure 5:
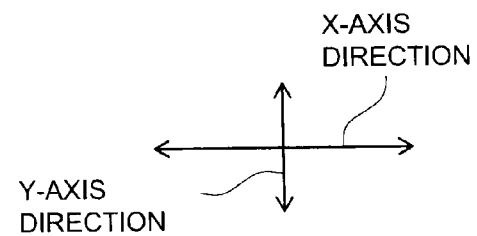

Mounting work for mounting the die 92 on a circuit substrate is performed in the electronic component mounting machine 10 as described above, but work for mounting an electronic component different from the die 92 can also be performed. When mounting work is changed, the flux supply device 26, the electronic component discharge device 28, and the die supply device 30 are changed into other devices. Specifically, the flux supply device 26 and the electronic component discharge device 28 are removed from the device pallet 70 first as shown in FIGS. 4 and 5, and the die supply device 30 is removed from the receiving section 86.

Figure 6:
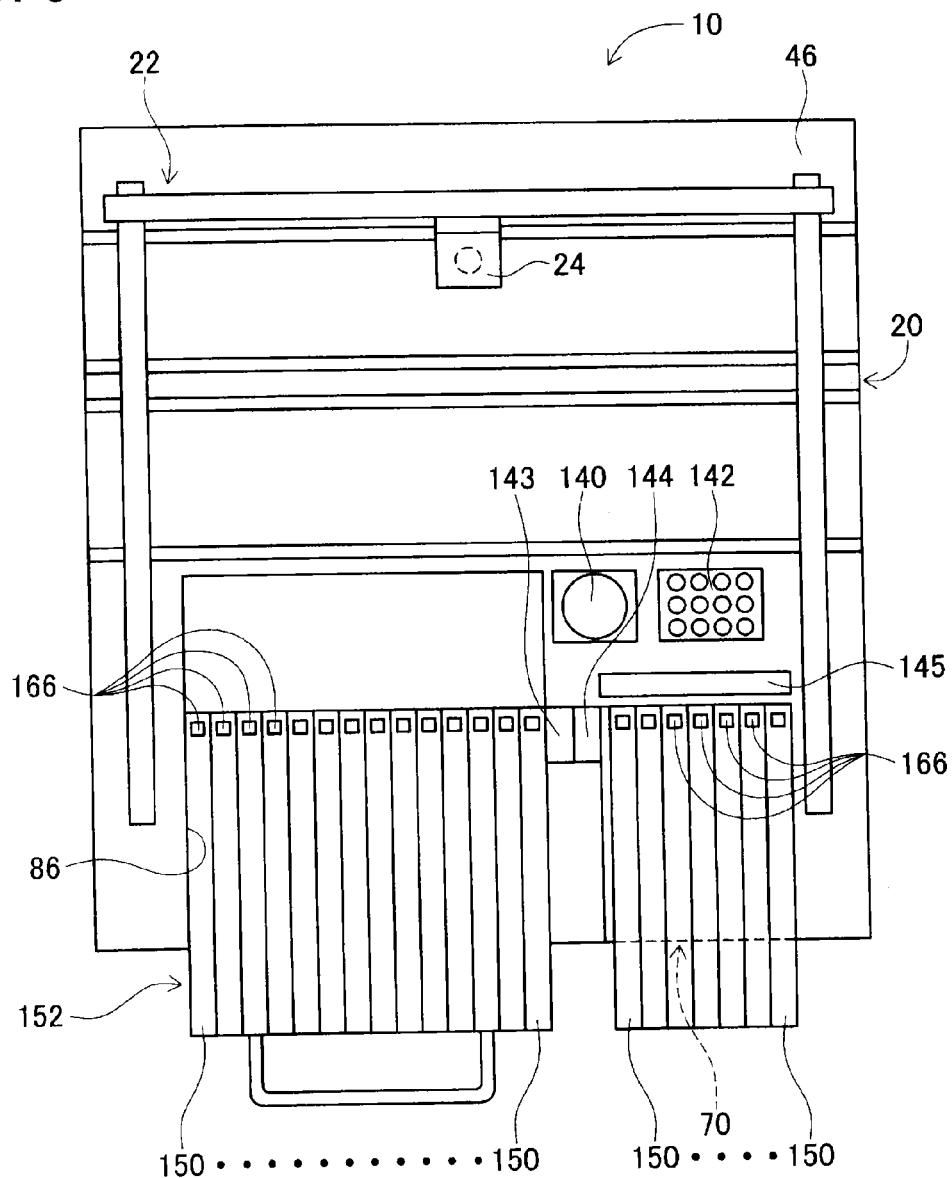
FIG. 6 is a plan view of the electronic component mounting machine on which tape feeders and an electronic component supply unit are mounted that is seen from an upper point of view.

Then, a plurality of tape feeders 150 are mounted on the device pallet 70 as shown in FIG. 6, and an electronic component supply unit 152 is received in the receiving section 86. The tape feeder 150 includes a body part (see FIG. 7) 160 and a storage section (see FIG. 7) 162. The body part 160 is formed in a substantially rectangular shape, and stands so as to extend in a longitudinal direction. Further, a slide part (see FIG. 7) 164 is provided on the bottom of the body part 160, and the slide part is adapted so as to be capable of being fitted to the grooves 75 of the device pallet 70. Accordingly, the body part 160 of the tape feeder 150 is mounted on the device pallet 70. Meanwhile, the body part 160 of the tape feeder 150 is also detachably mounted on the device pallet 70 like the body base 72 of the flux supply device 26 and the like.

The storage section 162 of the tape feeder 150 stores a tape-shaped component so that the tape-shaped component is wound. The tape-shaped component is electronic components that are packed as the form of a tape. Further, the tape-shaped component is drawn from the storage section 162 and extends on the upper end face of the body part 160. The tape feeder 150 sends the tape-shaped component by the operation of a feeding device (not shown). Accordingly, the tape feeder 150 supplies an electronic component at a supply position 166 that is provided at an end portion of the upper end face of the body part 160.

Meanwhile, the body part 160 is provided with a connector (not shown). When the body part 160 is mounted on the device pallet 70, the connector is connected to the connector connection portion of the device pallet 70. Accordingly, the tape feeder 150 is electrically connected to the electronic component mounting machine 10.

Figure 7:
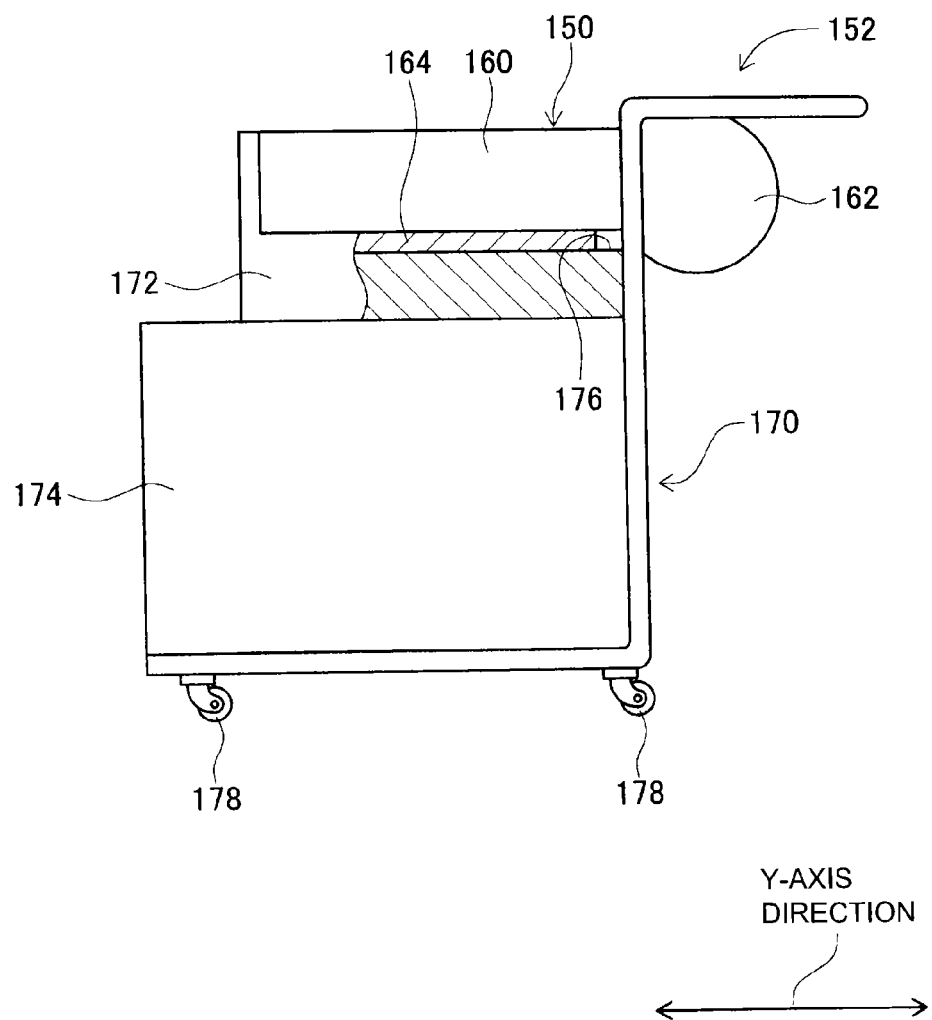
FIG. 7 is a side view of the electronic component supply unit.

Further, the electronic component supply unit 152 includes a cart 170, a feeder mounting stand 172, and the plurality of tape feeders 150 as shown in FIG. 7. The feeder mounting stand 172 is provided on the cart 170 with a base 174 interposed therebetween. A plurality of grooves 176, which extend in the Y-axis direction, are formed on the upper surface of the feeder mounting stand 172. The grooves 176 are formed in the same shape as the grooves 75 formed on the device pallet 70, and the slide part 164 of the tape feeder 150 is adapted so as to be capable of being fitted to the grooves 176. Accordingly, the plurality of tape feeders 150 are mounted on the feeder mounting stand 172. Meanwhile, other devices, such as the flux supply device 26 and the electronic component discharge device 28, can also be mounted on the feeder mounting stand 172.

Further, the tape feeders 150 mounted on the feeder mounting stand 172, that is, the tape feeders 150 of the electronic component supply unit 152 received in the receiving section 86 and the tape feeders 150 mounted on the device pallet 70 are provided at the same positions in the Y-axis direction as shown in FIG. 6. For this reason, the supply positions 166 of the tape feeders 150 of the electronic component supply unit 152 and the supply positions 166 of the tape feeders 150 mounted on the device pallet 70 are positioned on one row so as to extend in the X-axis direction. Accordingly, since the coordinates of the positions of all the supply positions 166 in the Y-axis direction are the same as each other, it is convenient to control the position of the mounting head 24 when the mounting head 24 is moved.

Furthermore, casters 178 are mounted on legs of the cart 170. Accordingly, the electronic component supply unit 152 can be easily moved on the floor and the electronic component supply unit 152 is easily mounted on and detached from the receiving section 86. Meanwhile, the base 174 is provided with a connector (not shown), and the receiving section 86 is provided with a connector connection portion (not shown). Accordingly, when the electronic component supply unit 152 is received in the receiving section 86, the electronic component supply unit 152 is electrically connected to the electronic component mounting machine 10.

It is possible to easily change mounting work by exchanging the devices, which are received in the receiving section 86, and the devices, which are mounted on the device pallet 70, in the electronic component mounting machine 10 as described above. In particular, since the receiving section 86 and the device pallet 70 are disposed at the front edge portion of the base 46 so as to be adjacent to each other in the electronic component mounting machine 10, an operator can perform work for exchanging devices at the edge portion. Accordingly, it is possible to more easily change mounting work.

Moreover, the part camera 140, the nozzle changer 142, and the tape discharge duct 145 are provided between the conveying device 20 and the device pallet 70 in the electronic component mounting machine 10. The part camera 140 takes an image of an electronic component before mounting work, and is very frequently used. Further, the nozzle changer 142 exchanges a nozzle in accordance with the change of the mounting work and the like, and is frequently used at the time of the change of work. Furthermore, the tape discharge duct 145 is a duct that is used to discard an unnecessary waste tape, and is necessarily used when the tape feeder is used. Devices, which are frequently used, are provided between the conveying device 20 and the device pallet 70 as described above. That is, devices, which are frequently used, are positioned on a moving path of the mounting head 24 that is moved between the device mounted on the device pallet 70 and a circuit substrate. Accordingly, while the mounting head 24 is moved between the device mounted on the device pallet 70 and a circuit substrate, it is possible to perform work using the part camera 140 and the like. Therefore, it is possible to shorten working time.

Further, the devices that are to be received in the receiving section 86 and the devices that are to be mounted on the device pallet 70 can be freely combined in the electronic component mounting machine 10. Specifically, for example, as shown in FIG. 8, the electronic component supply unit 152 can be received in the receiving section 86 and the flux supply device 26 and the electronic component discharge device 28 can be mounted on the device pallet 70.

Figure 8:
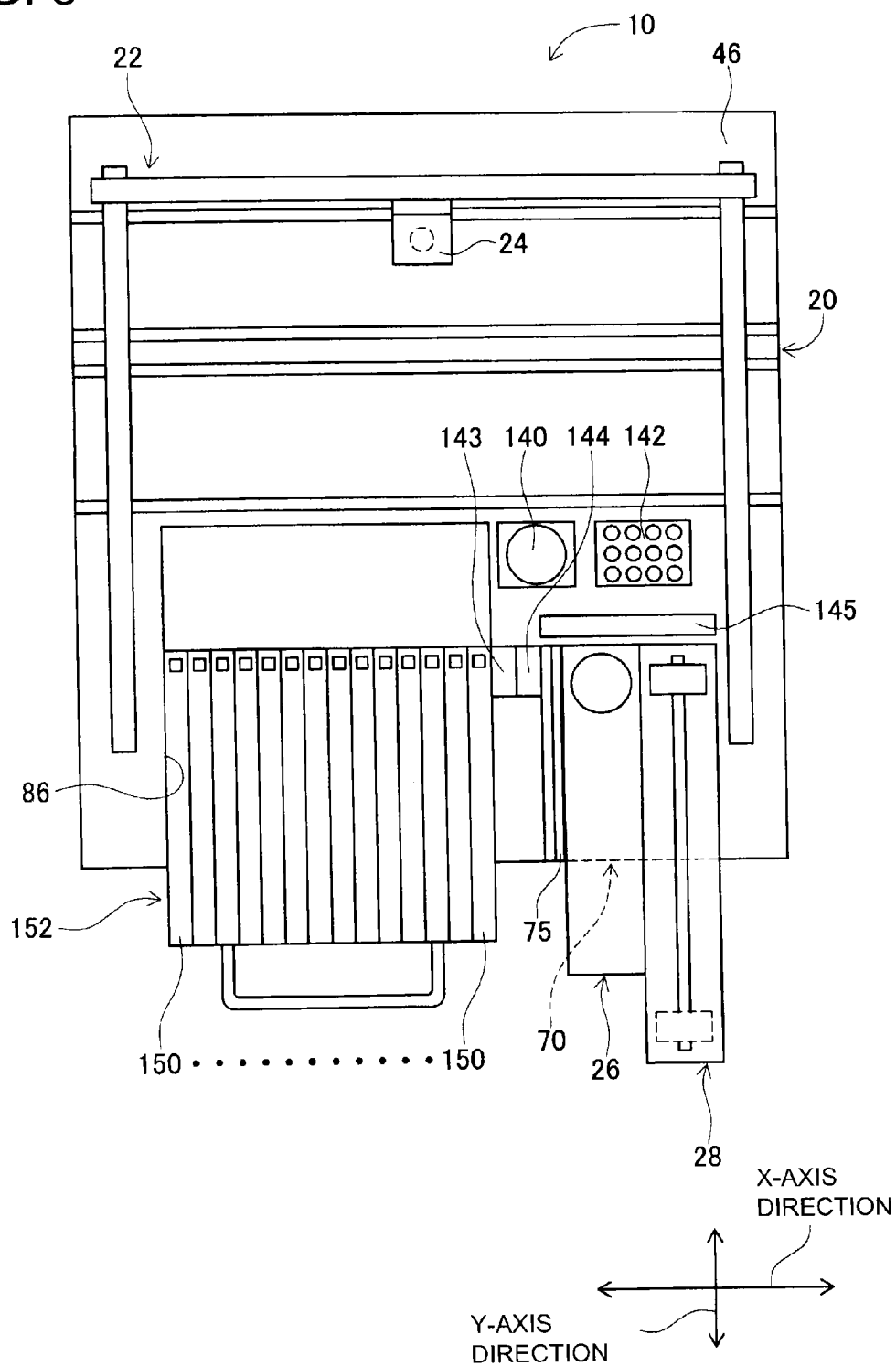
FIG. 8 is a plan view of the electronic component mounting machine on which the electronic component supply unit, the flux supply device, and the electronic component discharge device are mounted that is seen from an upper point of view.

In the electronic component mounting machine 10 shown in FIG. 8, the flux supply device 26 and the electronic component discharge device 28 are mounted on the device pallet 70 as in the electronic component mounting machine 10 shown in FIG. 2. The flux supply device 26 supplies flux, and is used in relatively many kinds of mounting work. The electronic component discharge device 28 discharges a defective electronic component and the like to the outside of the electronic component mounting machine 10, and is necessary in almost all kinds of mounting work. That is, devices, which are used in many kinds of mounting work, are mounted on the device pallet 70. Accordingly, even when mounting work is changed, the need of the exchange of the flux supply device 26 and the like to other devices is reduced. As a result, it is possible to reduce the number of times of work for exchanging the device mounted on the device pallet 70.

Figure 9:
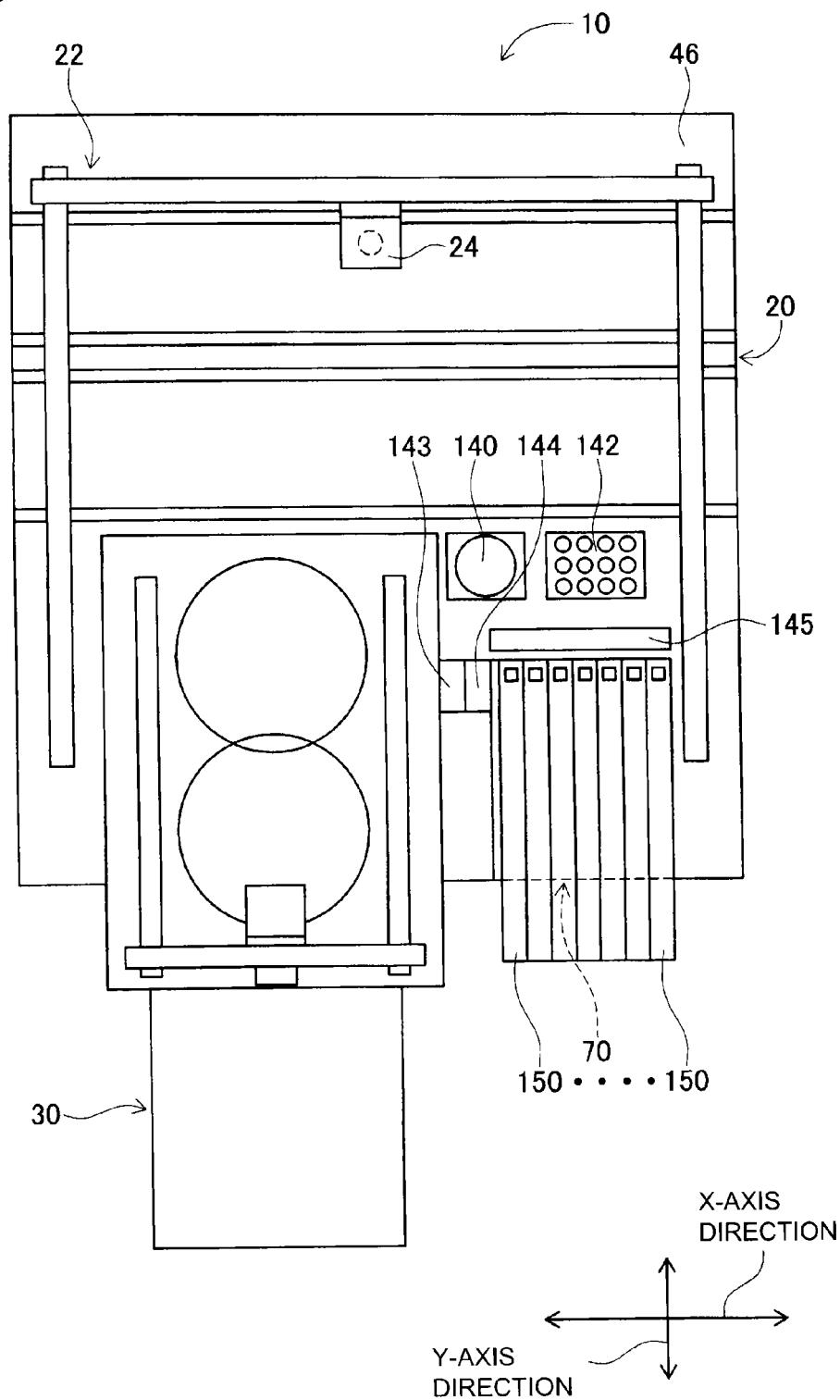
FIG. 9 is a plan view of the electronic component mounting machine on which the die supply device and the tape feeders are mounted that is seen from an upper point of view.

Furthermore, as the combination of the devices that are to be received in the receiving section 86 and the devices that are to be mounted on the device pallet 70, for example, the die supply device 30 is received in the receiving section 86 and the plurality of tape feeders 150 can be mounted on the device pallet 70 as shown in FIG. 9. Work for mounting the die 92 and an electronic component can be performed in this electronic component mounting machine 10.

Incidentally, the electronic component mounting machine is an example of a substrate working machine in the above-mentioned embodiment. The cover 12 is an example of a first cover, and the rack cover 114 is an example of a second cover. The conveying device 20 is an example of a conveying device. The flux supply device 26 is an example of a second mounting work-correspondence device and a viscous fluid supply device. The electronic component discharge device 28 is an example of the second mounting work-correspondence device and a component discharge device. The die supply device 30 is an example of a first mounting work-correspondence device. The base 46 is an example of a base. The device pallet 70 is an example of a mounting stand. The receiving section 86 is an example of a receiving section. The casters 130 and 178 are an example of a moving mechanism. The part camera 140, the nozzle changer 142, and the tape discharge duct 145 are an example of a processing device. The tape feeder 150 is an example of the second mounting work-correspondence device. The electronic component supply unit 152 is an example of the first mounting work-correspondence device. The die 92 and the electronic component are an example of a mounting component.

Meanwhile, the disclosure is not limited to the above-mentioned embodiment, and may have various modifications and improvements on the basis of the knowledge of those skilled in the art. Specifically, for example, the flux supply device 26, the electronic component discharge device 28, and the tape feeder 150 have been employed as the devices that are to be mounted on the device pallet 70 in the above-mentioned embodiment, but various devices can be employed. Specifically, for example, a nozzle cleaning device that cleans the suction nozzle 60, a component tray on which electronic components are to be placed, a component removing device that forcibly separates an electronic component from the suction nozzle 60, and the like can be employed.

Further, the die supply device 30 and the electronic component supply unit 152 have been employed as the devices that are to be received in the receiving section 86 in the above-mentioned embodiment, but various devices can be employed. Specifically, for example, a tray-type component supply unit in which a plurality of component trays are received and the like can be employed.

Furthermore, the device pallet 70 and the receiving section 86 have been disposed at the front edge portion of the base 46 so as to be adjacent to each other in the above-mentioned embodiment, but may be disposed so as to be spaced away from a predetermined edge portion by a certain distance. Moreover, for example, a mechanism, a device, and the like may be provided between the device pallet 70 and the receiving section 86.

REFERENCE SIGNS LIST

- 10: electronic component mounting machine (substrate working machine)
- 12: cover (first cover)
- 20: conveying device
- 26: flux supply device (second mounting work-correspondence device) (viscous fluid supply device)
- 28: electronic component discharge device (second mounting work-correspondence device) (component discharge device)
- 30: die supply device (first mounting work-correspondence device)
- 46: base
- 70: device pallet (mounting stand)
- 86: receiving section
- 114: rack cover (second cover)
- 130: caster (moving mechanism)
- 140: part camera (processing device)
- 142: nozzle changer (processing device)
- 145: tape discharge duct (processing device)
- 150: tape feeder (second mounting work-correspondence device)
- 152: electronic component supply unit (first mounting work-correspondence device)
- 178: caster (moving mechanism)

The invention claimed is:

1. A substrate working machine that performs mounting work on a circuit substrate, the substrate working machine comprising, when a device functioning as at least one of a device supplying an item necessary for the mounting work to be performed on the circuit substrate, a device discharging an item unnecessary in the mounting work, and a device performing processing required for the mounting work is defined as a mounting work-correspondence device:
a base;
a receiving section that is formed in the base and that receives a first mounting work-correspondence device including a moving mechanism configured to allow the first mounting work-correspondence device to be moved on a floor into the receiving section;
a mounting stand on which a second mounting work-correspondence device is detachably mounted, the second mounting work-correspondence device being different from the first mounting work-correspondence device received in the receiving section; and
a mounting head moving device which moves a mounting head, the mounting head moving device including a pair of first guide rails extending in a first direction, a second guide rail extending between the pair of first guide rails in a second direction perpendicular to the first direction and movable in the first direction on the pair of first guide rails, and a slider movable in the second direction on the second guide rail on which the mounting head is mounted,
wherein the mounting stand is fixed at a front edge portion of the base at a first side of the substrate working mounting machine in the second direction and the receiving section is formed at the front edge portion of the base at a second side of the substrate working mounting machine opposite the first side of the substrate working mounting machine in the second direction, the receiving section having a recessed shape extending rearward in the first direction from the front edge portion of the base so as to present a cavity delimited by first and second side walls extending in the first direction and a rear wall connecting the first and second side walls,
wherein a portion of the pair of first guide rails extends over the first and second side walls of the receiving section in the first direction so that the receiving section and the mounting stand are between the pair of first guide rails, and
wherein one of the first guide rails is disposed between the first side wall of the receiving section and the first side of the substrate working machine, and the other of the first guide rails is disposed between the second side wall of the receiving section and the second side of the substrate working machine so that the receiving section and the mounting stand are between the pair of first guide rails.

2. The substrate working machine according to claim 1, wherein the mounting stand and the receiving section are disposed at the front edge portion of the base so as to be adjacent to each other so that a discard box is provided between the mounting stand and the receiving section.

3. The substrate working machine according to claim 1, further comprising:
a conveying device that is provided on the base and conveys the circuit substrate; and
a processing device that performs processing before or after the mounting work,
wherein the processing device is provided on the base between the mounting stand and the conveying device.

4. The substrate working machine according to claim 1, wherein both of the first mounting work-correspondence device and the second mounting work-correspondence device each function as a device that supplies a mounting component to be mounted on the circuit substrate, and
a supply position for a mounting component supplied by the first mounting work-correspondence device and a supply position for a mounting component supplied by the second mounting work-correspondence device are positioned on one row.

5. The substrate working machine according to claim 1, wherein the second mounting work-correspondence device is at least one of a viscous fluid supply device that supplies viscous fluid fixing the mounting component to the circuit substrate, a component discharge device that discharges an unnecessary mounting component, and a cleaning processing device that performs processing for cleaning a holder holding the mounting component.

6. The substrate working machine according to claim 1, further comprising:
a first cover that covers an upper portion of the substrate working machine and is made of a transparent material,
wherein the first mounting work-correspondence device includes a rack for a component to be mounted on the circuit substrate and a second cover that covers the rack of the first mounting work-correspondence device and is made of a transparent material.

7. The substrate working machine according to claim 1, further comprising a part camera, a nozzle changer, and a tape discharge duct, wherein the part camera, the nozzle changer, and the tape discharge duct are disposed between the second side wall of the receiving section and the other of the first guide rails.

8. A substrate working machine that performs mounting work on a circuit substrate, the substrate working machine comprising, when a device functioning as at least one of a device supplying an item necessary for the mounting work to be performed on the circuit substrate, a device discharging an item unnecessary in the mounting work, and a device performing processing required for the mounting work is defined as a mounting work-correspondence device:
  a base;
  a receiving section that receives a first mounting work-correspondence device including a moving mechanism configured to allow the first mounting work-correspondence device to be moved on a floor into the receiving section;
  a mounting stand being fixed to a front edge portion of the base; and
  a mounting head moving device which moves a mounting head, the mounting head moving device including a pair of first guide rails extending in a first direction, a second guide rail extending between the pair of first guide rails in a second direction perpendicular to the first direction and movable in the first direction on the pair of first guide rails, and a slider movable in the second direction on the second guide rail on which the mounting head is mounted, wherein
  the mounting stand is fixed at a front edge portion of the base at a first side of the substrate working mounting machine in the second direction and the receiving section is formed at the front edge portion of the base at a second side of the substrate working mounting machine opposite the first side of the substrate working mounting machine in the second direction, the receiving section has a recessed shape being formed at the front edge portion of the base extending rearward in the first direction from the front edge portion of the base so as to present a cavity delimited by first and second side walls extending in the first direction and a rear wall connecting the first and second side walls, the receiving section being adjacent to the mounting stand,
  multiple grooves are formed at an upper surface of the mounting stand so as to extend in the first direction,
  a second mounting work-correspondence device different from the first mounting work-correspondence device received in the receiving section is detachably mounted on the mounting stand,
  a slide portion is formed at an under surface of the second mounting work-correspondence device,
  the slide portion is configured to fit in the grooves so that the second mounting work-correspondence device is detachably mounted at the mounting stand,
  a portion of the pair of first guide rails extends over the first and second side walls of the receiving section in the first direction so that the receiving section and the mounting stand are between the pair of first guide rails, and
  one of the first guide rails is disposed between the first side wall of the receiving section and the first side of the substrate working machine, and the other of the first guide rails is disposed between the second side wall of the receiving section and the second side of the substrate working machine so that the receiving section and the mounting stand are between the pair of first guide rails.

9. The substrate working machine according to claim 8, further comprising a part camera, a nozzle changer, and a tape discharge duct,
  wherein the part camera, the nozzle changer, and the tape discharge duct are disposed between the second side wall of the receiving section and the other of the first guide rails.

* * * * *